United States Patent [19]

Meierdierck

[11] Patent Number: 5,029,271
[45] Date of Patent: Jul. 2, 1991

[54] SUPERREGENERATIVE DETECTOR

[75] Inventor: Charles Meierdierck, Huntington Station, N.Y.

[73] Assignee: Merit Electronic Design Co., Ltd., Deer Park, N.Y.

[21] Appl. No.: 503,717

[22] Filed: Mar. 30, 1990

Related U.S. Application Data

[62] Division of Ser. No. 146,110, Jan. 20, 1988, Pat. No. 4,935,736.

[51] Int. Cl.[5] .............................................. H03D 1/00
[52] U.S. Cl. .................................... 329/347; 329/351; 329/358
[58] Field of Search ............... 329/347, 349, 351, 358, 329/359

[56] References Cited

U.S. PATENT DOCUMENTS

4,228,546 10/1980 Ogita ............................... 329/358 X
4,935,736 6/1990 Meierdierck .................... 329/109 X Primary Examiner—Robert J. Pascal
Attorney, Agent, or Firm—Paul C. Scifo

[57] ABSTRACT

An improved superregenerative detector including input elements for receiving a high frequency carrier signal having an amplitude envelope upon which an information signal is impressed, the detector also including a first and a second oscillator and output elements for producing an output signal corresponding to the information signal. The detector features use of feedback components among the output elements, the feedback components including an operational amplifier and reference signal connected to the first and second oscillators such that the output signal of the operational amplifier may be used to constrain a transistor that defines the first amplifier to operate within its linear portion.

4 Claims, 4 Drawing Sheets

SUPERREGENERATIVE DETECTOR

This is a division of application ser. no. 07/146,110 filed Jan. 20, 1988, that has issued as U.S. pat. no. 4,935,736, the contents of which are incorporated herein by reference.

BACKGROUND OF THE INVENTION

1. Field of The Invention

This invention concerns an improved superregenerative detector that may be used in the radio frequency remote control of appliances, such as ceiling fans, and/or associated lighting, and more particularly, a superregenerative detector including feedback elements within the detector for stabilizing the detector output.

2. Description of Related Art

The remote control of business and home appliances, particularly ceiling fans and companion lighting, has become increasingly more popular. Such features as variable fan speed, fan reversibility, light intensity adjustment, and decorative appearance have made the ceiling fan and companion light a sought after addition to households and work environments. Further, these popular features have been made even more attractive with the advent of controllers that permit the user to vary the fan and light functions at a distance and without the need for manipulating a pull chain or string unattractively hanging from the fan or light.

However, there have been drawbacks associated with certain forms of remote control. For example, remote control by infrared or ultrasound suffer from "line-of-sight" limitation. Particularly, these forms experience signal interruption in the presence of physical obstructions such as walls, floors, etcetera, or even the blades of the fan itself. Additionally, these approaches are susceptible to interference from "noise", e.g., background light and sound, which may cause false control of the system.

On the other hand, however, remote control of appliances such as ceiling fans and associated lighting has been effectively accomplished with radio frequency (r.f.) signals. Physical objects such as walls, floors, and the like, while obstructions to light and sound forms of remote control, are transparent to r.f. signals. Further, an r.f. transmitter can be easily carried and manipulated by hand thereby permitting the operator freedom of use.

While r.f. controllers for combined ceiling fan and lighting fixtures have been known, problems have existed with them. For example, certain designs have been elaborate and complicated raising questions of cost and reliability. In accordance with certain prior designs, pulse counting techniques proposed for processing the control data required use of separate channels and frequencies to manage fan operation and light intensity. Accordingly, this multiplication of channels and frequencies results in an increase in system complexity and duplication of system components. As will be appreciated, increased complexity and component duplication raise cost and reduce reliability; results which are commercially unattractive.

R.f. controllers, however, have been developed which permit control of multiple fan features as well as operation of associated lighting, with a single frequency and channel. MEDCO, Ltd. of Deer Park, N.Y., has offered a fan and light controller of digital designs which features a pulse-width modulation scheme in a single-channel system. The Medco controller permits control of fan activation, speed selection and direction as well as the intensity of associated lighting with a single modulated r.f. carrier signal.

However, even in single-channel systems of the type offered by MEDCO, Ltd., competing design considerations creates difficulties. Particularly, in order to stay price competitive, the system component costs must be kept low. But, where component costs are cut, as for example, by using a low-cost detector such as one of the superregenerative type that employs fewer components that other types such as the superregenerative type, sensitivity is reduced. And, where receiver sensitivity is reduced, system range is, likewise, reduced, with the effect of preventing use of the remote controller where it can be particularly attractive; for example, large rooms or high ceilings commonly found in commercial or industrial buildings, or from adjoining rooms or outside residential structures.

Further, since the sensitivity and reliability of operation of a conventional superregenerative detector depends upon the range of linearity of the active components included in the detector, it is necessary to specially select such active components for required linearity. However, specially selecting active components for linearity increases their costs and prevents realization of the full potential for cost reduction that the reduced component count of a superregenerative detector would otherwise present.

SUMMARY OF INVENTION

Accordingly, it is an object of this invention to provide a superregenerative detector of low cost.

It is a further object of this invention to provide a superregenerative detector that does not require use of specially selected active components.

It is yet another object of this invention to provide a superregenerative detector that is tolerant of non-linearity in its active components.

It is a still further object of this invention to provide a superregenerative detector that may be used in an r.f. controller capable of remotely controlling electrical loads having resistive or complex impedances.

Briefly, the superregenerative detector of this invention features input elements for receiving a high frequency carrier signal having an amplitude envelope upon which an information signal is imposed. Additionally, the detector includes a first oscillator for generating a signal having a frequency corresponding to the frequency of the carrier and a second oscillator for generating a signal having a frequency lower than that of the first oscillator, but, higher than the frequency of the information signal. Further, the first and second oscillators are designed so that the duration of the first oscillator signal is responsive to the amplitude of the second oscillator signal and the amplitude of the received carrier. In accordance with the invention, the superregenerative detector also features output elements including feedback means connected to the first and second oscillators for stabilizing the detector output signal during operation.

In a preferred embodiment of the detector in accordance with the invention, the feedback means includes an operational amplifier having a first input connected to the second oscillator and a second input connected to a reference signal, and an output connected to the first oscillator. Further, in preferred form, the first oscillator includes a transistor having a tank circuit coupled between the transistor collector and base, and the second oscillator includes an LC network coupled to the transistor collector of the first oscillator and the first input of the operational amplifier, the output of the operational amplifier being connected to the transistor base of the first oscillator such that the feedback signal form the operational amplifier constrains the first oscillator transistor to operate in the linear portion of the transistor's operating characteristic.

DESCRIPTION OF THE DRAWINGS

The above and further objects, features and advantages of the invention will become clear from the following more detailed description read with reference to the accompanying drawings in which.

DESCRIPTION OF A PREFERRED EMBODIMENT

Figure 1:
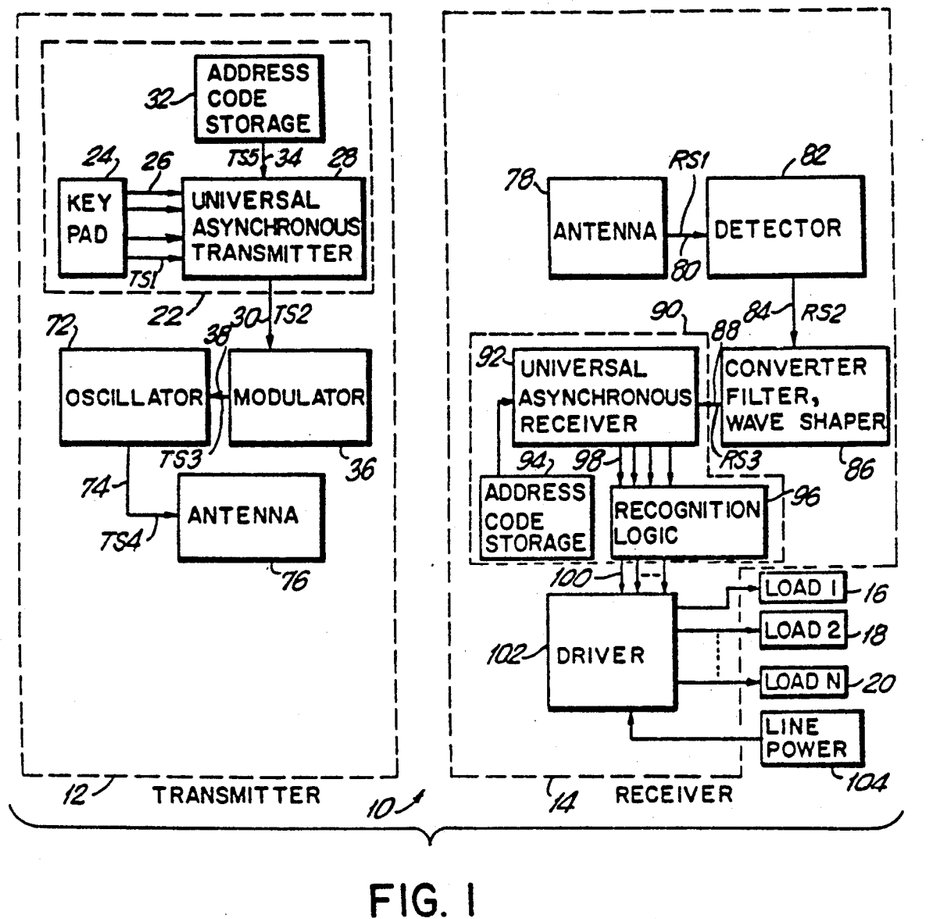
FIG. 1 is a block diagram of an r.f. controller that may include the superregenerative detector in accordance with the invention.

A controller including a preferred embodiment of the superregenerative detector in accordance with this invention is shown in block form in FIG. 1. With reference to FIG. 1, controller 10 includes a transmitter 12 and a receiver 14 for controlling a plurality of electrical loads 16, 18, 20. Although not shown for the sake of simplicity, receiver 14 is typically mounted displaced from transmitter 12 proximate loads 16, 18, 20 and includes the superregenerative detector. As shown, controller 10 is capable of controlling multiple loads, the maximum number being determined by the controller data structure and receiver configuration to be described more fully hereafter.

The impedances of the loads to be controlled may be either purely resistive or complex; i.e., either resistive, inductive or capacitive, or have some combination of these components. More particularly, controller 10 is capable of controlling predominantly resistive loads such as heaters, predominantly inductive loads such as fan motors, or predominantly capacitive loads such as fluorescent lamps or loads that respond to power as if they were capacitive such as the tungsten filaments of incandescent lamps.

In the case of a ceiling fan and companion light, receiver 14 containing the superregenerative detector may be conveniently mounted in the fan housing connected to the fan motor and lighting circuits. In this arrangement, receiver 14 would be connected to control the turning on and off of the fan, its speed and direction, as well is the activation of the lamp and its light intensity. As will be appreciated by those skilled in the art, controller 10 could actually well be used to control the fan alone or the lighting alone, of a plurality of fans or plurality of lights.

Continuing with reference to FIG. 1, in use, transmitter 12 may be either hand-held or mounted at some convenient location. The maximum distance transmitter 12 may be separated from receiver 14 is determined by the controller range. Since controller 10 is of the r.f. type, physical; obstructions such as walls and floors are transparent to the r.f. signals, and, accordingly, do not impede control if located between transmitter 12 and receiver 14. Accordingly, remote control of the loads may be conveniently effected form adjacent rooms or even outside the structure in which the loads are located.

As shown in FIG. 1, transmitter 12 includes a command generator 22 for generating coded load command signals TS2. More particularly, generator 22 includes a command selector 24, which in preferred form is a key pad.

As is well known in the art, key pad 24 may include a plurality of keys having identifying alphanumeric or symbolic indicia thereon. The keys are typically coupled to electrical circuitry within the pad for generating digital, data signals. Accordingly, when a key corresponding to a desired load command is depressed by the user, a unique, multibit, parallel, digital, data word signal, TS1, representing the selected load control command appears at pad output lines 26.

In accordance with the design of controller 10, command selection signals TS1 are formulated to both uniquely identify the command chosen and to, additionally, provide the data required to control the load. This approach has the economy of avoiding later generation of load control data in response to the command selection signals. As is well known, a digital data word having N bits is capable of representing $2^N$ unique states. Command selection signals TS1 are, therefore, fashioned as multibit, digital, data words so that each state of a word can represent a separate command; for example, selection of a particular fan speed, fan direction, or lighting level, etc. Further, in addition to defining the particular command, the state of the selection signal also constitutes the binary coded data used to control the load; i.e., the command selection signals contain the coded load control information.

To control a basic ceiling fan and light combination, a 6-button, 6-data line pad may be used. Further, for this arrangement, only 4 lines, i.e., 4 data bits, are used to represent 6 basic commands; e.g., fan forward; fan reverse; high fan speed; medium fan speed; low fan speed; and light intensity incrementation. As will be appreciated, if additional commands are desired, additional keys, lines, and data bits may be used as required. Further, and as is known in art, the technique of multiplexing may also be used to increase the number of commands that may be supplied over the data lines.

For simplicity and economy, controllers 10, features single-channel transmission of the control information to loads 16, 18, 20. Accordingly, the multi-line, parallel, digital, data originated by key pad 24, must be converted to single-line, serial, data word to facilitate transmission.

Additionally, because the form of digital data from key pad 24; i.e., amplitude modulated, is not well suited for broadcast, it also is converted prior to transmission. Particularly, signal pulses of varying amplitude from key pad 24 commonly used to represent the 1's and 0's of conventional digital data are susceptible to amplitude distortions during transmission. This distortion can create false 1's or 0's which has the effect of corrupting the data. Accordingly, it is more desirable to communicate pulses of a single amplitude, wherein the width of the pulses is varied to establish the data sequences of 1's and 0's. In this way, variations in the pulse amplitude which commonly occur during transmission are not as likely to confuse the data content represented in the pulse widths.

Universal asynchronous transmitter (UAT) 28 shown included in command generator 22 performs these functions and others. In a manner well known in the art, UAT 28 changes the parallel, digital, command signals, TS1, to serial, and converts the conventional amplitude varying digital signals of TS1 to pulse-width modulated, command signals, TS2.

Continuing, command generator 22 also includes means for adding address code information to the command signals, TS2. The address information is supplied in order to uniquely identify the receiver and associated loads to be controlled. As explained, physical obstructions such as wall, floors and the like are transparent to r.f. signals. Additionally, several receivers may be located within a room arranged for control by separate transmitters. Therefore, to avoid unintended control of receivers and loads within the range of transmitter 12, address information specifically identifying the receiver and companion loads can be added to control signals TS2.

For this purpose, as shown in FIG. 1, command generator 22 is provided with an address storage means 32. Storage means 32 is adapted to supply digital data that uniquely identifies the receiver that is companion to transmitter 12. Storage means 32 can take any convenient forms; e.g., a DIP switch, ROM or the like. Storage means 32 may be an 8-line, DIP switch to permit simple, manual entry of any one of 256 unique receiver addresses.

Still further command generator 28 may include elements for adjusting the repetition rate and nominal pulse width, as well as adding synchronization and start recognition bits to command signals TS2. The pulse-width modulated data words that constitute command signals TS2 are 18 bits in length. They include 5 synchronization bits, 8 receiver address bits, 4 load command bits and 1 start bit.

In the past, once command signals TS2 were generated, they were used to modulate an r.f. carrier which was, thereafter, broadcast to the receiver. However, as noted above, by providing the carrier signal with a modulation envelope corresponding to the pulse-width modulated command signals TS2, average power was added to the r.f. transmission which limited the extent to which the r.f. carrier amplitude could be increased. This, in turn, limited the amount of power that could be added to the transmission to compensate for reduced receiver sensitivity resulting from use of a low-cost superregenerative detector.

In controller 10, rather than use command signals TS2 to modulate the r.f. carrier, special modulations signals are generated which have substantially reduced widths as compared with the command signals, but which retain the receiver address and load control data of the command signals.

More particularly, the narrow-width, special modulation pulses are generated such that their positions in time, rather than their widths, convey the address and load control data, the special modulation pulses being generated at the leading and trailing edges of the pules-width modulated command signals TS2. In this way, the 1's and 0's of the address and load control data conveyed by the widths of the command signal pulses are transformed to the positions in time of the special modulation pulses, particularly, the difference in position of successive pulses. The narrow-width, modulation pulses can subsequently be used to modulate the r.f. carrier, and, thereby, substantially reduce the contribution to average transmission power that would otherwise result from use of the pulse-width modulated command signals. The advantage of this approach is that the amplitude of the carrier can be increased without exceeding F.C.C. limits on transmission power, and facilitate use of low-sensitivity receivers spaced at desirable distances form the transmitter.

As shown in FIG. 1, modulator 36 is connected to UAT 28 for this purpose. Particularly, modulator 36 includes a signal transformer responsive to the TS2 signals at UAT output 30 for generating the modulation pulses. As will be appreciated, the process of generating the modulation pulses in this fashion constitutes a differentiation of command signals TS2.

In controller 10, the modulator signal transformer is a compound exclusive OR gate, arranged to trigger on the leading and trailing edges of the pulse-width modulated command signals TS2.

Figure 4:
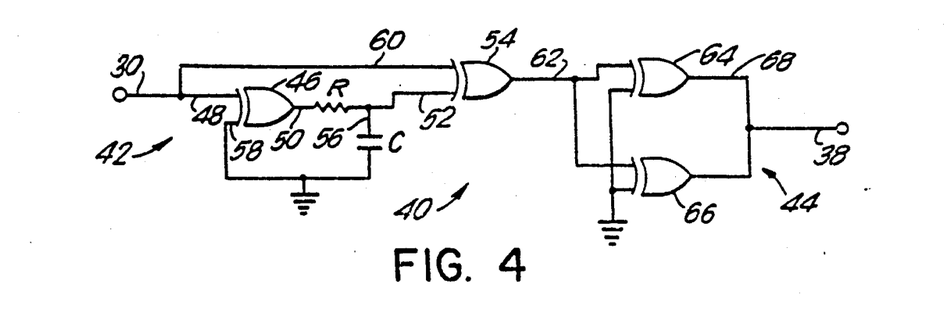
FIG. 4 is a logic diagram of a signal transformer which may be used in the transmitter modulator of the r.f. controller that may include the superregenerative detector in accordance with this invention.

As shown in FIG. 4 exclusive OR gate 40 includes a gate section 42 and a buffer section 44. Gate section 42 includes a first exclusive OR gate element 46 having a first input 48 coupled to UAT output 30. Further, the output 50 of gate element 46 is coupled to a first input 52 of a second exclusive OR gate element 54. First gate output 50 is connected to second gate input 52 through an RC network 56, at the resistor, capacitor node. The second input 58 of gate element 46, as shown, is also coupled to RC network 56, but, at the other side of capacitor C and to ground. Additionally, first input 48 of gate element 46 is coupled to second input 60 of gate element 54. Finally, the output 62 of gate element 54 is coupled to buffer section 44, which, as shown, includes third and fourth exclusive OR gate elements 64, 66, having their respective outputs 68, 70 coupled to the output 38 of modulator 36.

In operation, when pulse-width modulated command signal TS2 goes up (absolute value) at line 30, first input 48 of gate element 46 goes up. Further, since second input 58 of gate element 46 is tied to ground, the inputs to gate element 46 are 1 and 0 respectively. Therefore, output 50 of element 46 attempts to go up. However, output 50 is unable to rise until capacitor C of network 56 charges. Accordingly, first input 52 of gate element 54 initially remains low.

Continuing, since second input 60 of gate element 54 is tied to line 30, it, like first input 48 of gate element 46, goes up. Accordingly, since the inputs to gate element 54 are 0 and 1, output 62 of gate element 54 goes up. However, once capacitor C charges, first input 52 of gate element 54 also goes up, rendering the inputs to gate elements 54, 1, 1. This causing the outputs 62 of gate 54 to go low. Thus, a first pulse of prescribed width is generated at output 62 in response to the leading edge of the pulse-width modulated signal at 30.

Subsequently, when pulse-width modulated signal TS2 falls (absolute value) the inputs to gate element 46 go to 0, 0, respectively, and the output of first gate 46 attempts to fall. Additionally, second input 60 of second exclusive OR gate element 54 goes low. However, the charge at capacitor C keeps the first input at 52 of gate element 54 up until the capacitor C discharges. Thus, the inputs of gate 54 are 1, 0, respectively and the output 62 of gate element 54 goes up until capacitor C discharges. When capacitor C does discharge, the inputs to gate element 54 go to 0, 0, respectively, and output 62 goes low. This creates a pulse of prescribed width at the trailing edge of the pulse-width modulated signal TS2.

As will be appreciated, the pulse width of the modulation signal, i.e., the output of compound exclusive OR gate 40 is determined by the charge and discharge timer of RC combination 56; and preferably is between approximately 30 to 80 microseconds. As will also be appreciated, buffer section 44 of gate 40 serves to amplify the current output of gate section 42, and isolate circuit 40 from loading by other circuits to which output 38 is connected.

Also in accordance with the invention, once the modulation signals TS3 are created, they are used to modulate the amplitude of r.f. oscillator 72, shown in FIG. 1 connected to modulator 36 at modulator output 38. R.f. oscillator 72 may be of any convenient type having a sinusoidal output waveform to establish a transmitter carrier of approximately 300 megahertz frequency. Further, oscillator 72 is arranged with modulator 38 such that the pulses of modulation signals TS3 can turn oscillator 72 on and off. Particularly, in controller 10, modulation signals TS3 act as the drive for oscillator 72. Accordingly, during the modulation pulse, oscillator drive is provided, and, between the trailing and leading edge of sequential modulation pulses, no oscillator drive is provided. In this way, oscillator output, i.e., the 300 megahertz carrier, is provided at line 74 of oscillator 72 during the modulation signal pulses, and no oscillator output is provided at line 72 between modulation signal pulses. Since in controller 10, the modulation pulses have a width of between approximately 30 to 80 microseconds, and the carrier a frequency of 300 megahertz, many thousand of oscillator cycles are completed during the modulation signal pulse.

Subsequently, the amplitude modulated r.f. carrier signal having an envelope corresponding to the modulation signal pulses and containing the receiver address and load control information, is provided to an antenna 72 for broadcast to receiver 14. As will be appreciated, antenna 72 may be of any suitable type.

As will also be appreciated, transmitter 12 further includes a power source, not shown, to provide electrical power for the transmitter elements. In controller 10, the power source is a conventional battery supply to permit transmitter 12 to be portable.

Continuing, in accordance with the invention, controller 10 also includes a companion receiver 14 specially adapted to process and decode the r.f. signals broadcast by transmitter 12.

As shown in FIG. 1, receiver 14 includes an antenna 78 for receiving r.f. signals in the air. Antenna 78 may be of conventional type, that is sensitive to a band of frequencies which includes the modulated carrier signal of the transmitter; i.e., 300 megahertz.

Receiver 14 further includes a detector 82 in accordance with the invention connected to antenna output 80, configured to demodulate carrier signals TS4 present at antenna output 80. In accordance with the invention, detector 82 is of the low-cost type in order to maintain the cost of the receiver low. More particularly, detector 82 is a superregenerative detector As is known in the art, a superregenerative detector is designed to resonate at two frequencies, the r.f. frequency of the modulated carrier, and a frequency substantially lower that the carrier frequency, but higher than the carrier envelope frequency. In accordance with the design, detector oscillation at the r.f. frequency is turned on and off by the lower frequency, the exact time of r.f. oscillation initiation and quenching being randomly determined by circuit noise when no carrier is received. However, when the detector does receive carrier signal, depending on the carrier amplitude received, the r.f. oscillations of the detector initiate sooner and sustain longer. This produces an average high frequency signal that corresponds to the envelope of the carrier, the envelope representing the load control information. More particularly, the detector reproduces a signal corresponding to the modulation signals applied to the carrier at the transmitter, i.e., the narrow width pulses of signal TS3 containing the load control data encoded in the position of the pulses. Once demodulated, the carrier signal information is made available at output 84 of the detector as signals RS2.

Since detector signals RS2 contain the load control information in the position of the pulses in time, signals RS2 could be immediately decoded and load control signals extracted for driving the loads. Any convenient pulse position decoding technique could be used here. For example, a timing circuit could be used which compares successive detector pulses to a time reference; e.g., system clock, to identify pulse couplets which correspond to the 1's and 0's of the load control signals. Once the 1's and 0's of the load control signals are established, conventional decoder circuitry could be used in conjunction with companion drive means; e.g., triacs, to execute the control signals at the loads.

However, in the interest of maintaining the decoding process simple and low in cost, detector signals RS2, are, preferably, first converted to a form corresponding to the pulse-width modulated, serial, digital, data words originated by transmitter command generator 22. This enables simple universal asynchronous receiver circuitry to be used for extracting the load control information, as will be more fully described hereafter. To effect the transformation of the detector signals, receiver 14, includes a signal converter 86 as shown in FIG. 1.

Whether decoding is undertaken from the pulse-position encoded signals following detection, or from the pulse-width encoded signals following conversion, before decoding is attempted, it is preferred that the detector output signals RS2 be filtered and shaped to limit false load control due to spurious detector pulses. As noted above, the modulated carrier envelope is given the form of short duration, high amplitude pulses in order to limit average transmission power to F.C.C. limits, while increasing peak power to achieve acceptable range with a low sensitivity detector. This waveshape, however, is similar in appearance to "noise" generated by such sources as auto ignitions, lightning, electric motors and the like.

Accordingly, to reduce detector signals which result from noise, filtering means to exclude detector pulses not corresponding to the transmitted carrier envelope are preferably provided in receiver 14. In controller 10, both high-pass and low-pass filter elements are provided in signal converter 86. The filter elements are selected to anticipate, respectively, the pulse width and pulse position which may be given to the carrier envelope; i.e., the range of forms for the transmitter modulation signals, and to pass only detector pulses having a pulse width and position within the permissible range.

Additionally, converter 86 includes pulse shaping means to provide the detector output pulse signals with a generally rectangular form. In this regard, it has been found convient to formulate the wave shaper as an operational amplifier having two inputs, to one of which the detector pulses are provided and to the other of which a constant reference potential is provided. This arrangement enables the operational amplifier to produce a predetermined output amplitude (pulse height) for the period the detector signal exceeds the reference potential (pulse widths); i.e., a predetermined, substantially rectangular form.

Following filtering and shaping, the detection signals are ready for decoding. In the arrangement shown, the detection signals are converted from the pulse-position encoded form to a pulse-width encoded form suitable for processing by universal asynchronous receiver circuitry. This can be simply accomplished by using the detection signals to drive a flip-flop whose output goes to a predetermined high level when a first detector pulse is received and goes to a low level when a subsequent detector pulse is received, continuing in this fashion in response to subsequent pulses. The conversion has the effect of shifting; i.e., transforming, the load control data from the positions of the detector pulses to the widths of the pulse-width modulated signals at the flip-flop output. In this way, signals corresponding to the transmitter command signals can be generated at output 88 of the converter, particularly, multibit, pulse-width modulated, serial, digital, data words containing the load control information.

Continuing, receiver 14 further includes a decoder 90 connected to the output 88 of converter 86. As shown in FIG. 1, decoder 90 preferably includes universal asynchronous receiver (UAR) 92. As is well known in the art, UAR 92 includes a combination of circuits capable of changing the serial, pulse-width modulated signals into parallel digital data words that enable the command signals to be implemented.

Additionally, decoder 90 includes receiver address recognition elements to enable decoder 90 to identify control information intended for the receiver and its loads.

Still further, decoder 90 includes load control recognition logic 96 which identify the load control data and generate load control signals that subsequently cause the loads to be driven in accordance with the command entered at key pad 24.

With regard to receiver address recognition, as noted, physical obstructions such as walls and floors are transparent to r.f. signals. Accordingly, since several receivers may be located near one another; e.g., in the same or adjacent rooms, transmitter 12 preferably adds address information to the command signals to avoid unintended control. In accordance with this approach, decoder 90 includes address recognition elements to identify control signals intended for its companion receiver.

Specifically, decoder 90 includes address storage means 94 which contains data corresponding to the data held by address storage means 32 of transmitter 12, and inserted in the command signals to uniquely identify the receiver. Storage means 94 is arranged to supply the address data to a comparator provided at decoder UAR 92. The comparator of UAR 92 is arranged to compare the address information of command signals RS3 from converter 86 with the address data stored at the receiver. If the address data stored at decoder 90 matches the address data encoded in the command signal, UAR 92 processes the load control data associated with the command signal. In controller 10, several successive comparisons showing agreement are required before correspondence is assumed.

Storage means 32 can take a number of convenient forms; e.g., a DIP switch, ROM or the like. In controller 10, storage means 94, like transmitter storage means 32, is an 8-line, DIP switch that permits manual entry of any of 256 unique address codes, and specifically, an address code to match the code entered at address storage means 32 of companion transmitter 12.

Once UAR 92, and address storage means 94 identify a command signal intended for the receiver, UAR 92, thereafter, transforms the load control information from the serial, pulse-with modulated signals of converter 86 to multibit, parallel, digital, data word signals. As noted in connection with the discussion of command generator 22, the command words preferably use 4 data bits. Accordingly, UAR 92 provides the load control data as 4 bit, parallel data words at UAR output 98.

As shown in FIG. 1, the parallel, load control data words generated at UAR 92 are, thereafter, supplied to recognition logic 96 which contains elements for converting the control data to load control signals. In controller 10, recognition logic 96 includes a 4 to 16 line demultiplexer which interprets the data content in the parallel digital data word of UAR 92, and provides a signal at an output line dedicated to represent the load command corresponding to the data. The load control signals corresponding to the identified load control data are provided at output 100 of recognition logic 96.

Continuing with reference to FIG. 1, receiver 14 also includes a load driver 102. As shown, driver 102 is connected to the output 100 of decoder logic 96, loads 16, 18, 20 and external power.

As noted, each of the lines at decoder output 100 supplies a unique load control signal, a particular line being activated when a command signal containing the corresponding control data is processed by decoder 90. Accordingly, driver 102 includes drive means connected to the load control signal lines, the loads and the load power so that when a particular load control line is activated, the corresponding load is driven.

In controller 10, the drive means includes a plurality of gated switching elements; e.g., triacs, respectively, connected to the load it is to control, the corresponding load control signal line, and, where appropriate, load power. When a load control signal is provided by the decoder, a command signal is generated so as to trigger the switching element.

As in the case of transmitter 12, receiver 14 further includes a power source, not shown, to provide electrical power for the receiver elements and, where required, the loads. Since receiver 14 is in a stationary mount proximate the loads, an internal power supply driven by external electrical energy; e.g., 120 volt wall line, may be used.

Figure 2:
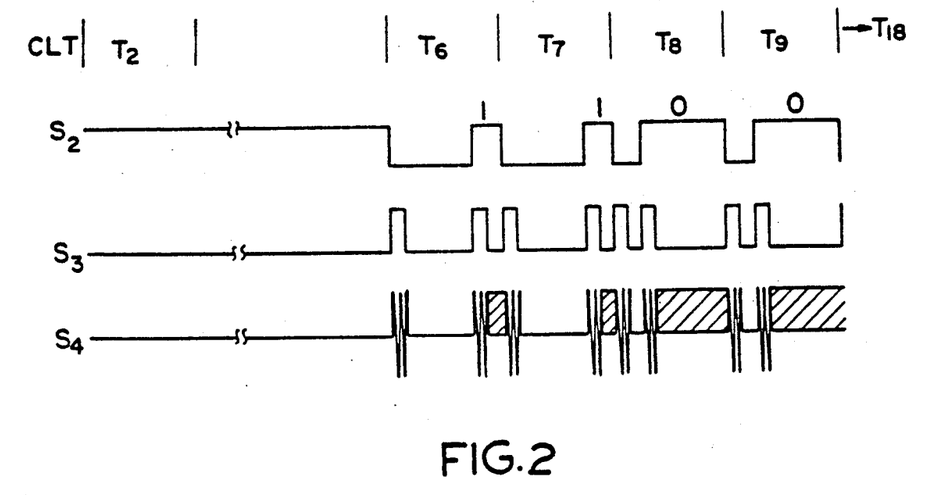
FIG. 2 is an illustration of portions of certain signals produced by the transmitter of the r.f. controller that may include the superregenerative detector in accordance with this invention.
Figure 3:
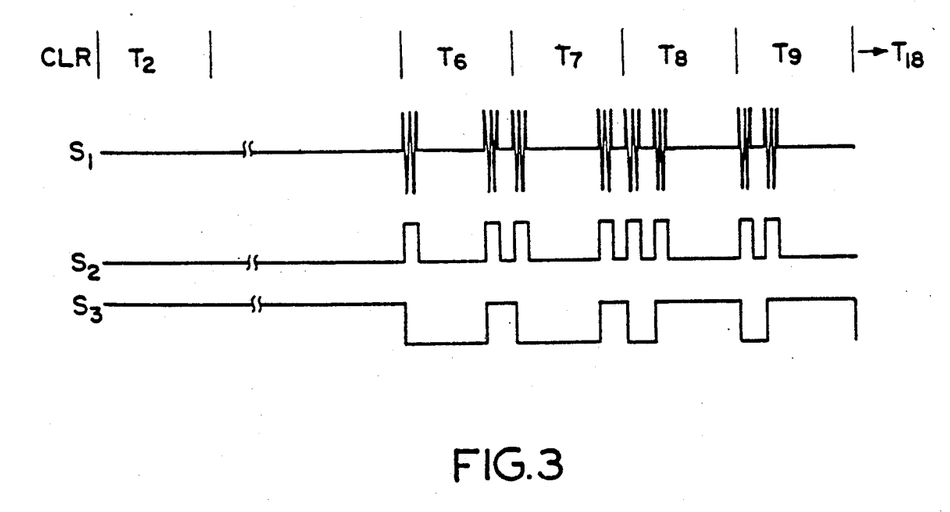
FIG. 3 is an illustration of portions of certain signals produced by the receiver of the r.f. controller that may include the superregenerative detector in accordance with this invention.

A better understanding of the various signals generated in transmitter 12 and receiver 14 and their relationships to each other may be had on reference to FIGS. 2 and 3. With regard to transmitter 12, and FIG. 2, TS2 represents the transmitter coded command signals. As explained, the command signals are multibit, serial, digital, data words comprised as sequences of pulse-width modulated pulses.

In controller 10, the command signal data words include 18 bits: 5 synchronization; 8 receiver address; 4 load control and 1 start. In FIG. 2, by way of illustration, 5 bits are shown, particularly, bit 2 and bits 6 to 9. As is well known in the art, the bit length is defined by the interval of the system clock signals CLT. In preferred form, the transmitter clock intervals are approximately 1.8 milliseconds in length. Further, the 1's and 0's of the command word data are comprised of pulses having widths which are modulated between ¼th and ¾ths, respectively, of the clock interval. For example, the command signal pulses at clock intervals 6 and 7 are 1's, and at intervals 8 and 9, 0's; intervals 2 to 5, partially shown, represent synchronization delay.

In controller 10, to reduce the contribution to average transmission power that would result if the command signal pulses were used to modulate the transmitter oscillator, special signals, as described above, are generated for modulating the transmitter oscillator. These modulation signals, shown in FIG. 2 as TS3 pulses, have substantially reduced pulse widths as compared with the command signal pulses, but, retain the information of the command signals by having positions in time corresponding to the leading and trailing edges of the command signal pulses. In controller 10, the width of the modulation pulses TS3, are between approximately 30 to 80 microseconds, as compared to the widths of the command signal pulses which range form approximately 450 (1's) to 1,350 (0's) microseconds. As shown, the difference between the position in time of successive modulation signal pulses, as measured from the synchronization reference, i.e., the end of the synchronization delay, identifies the 1's and 0's of the address and control data. Thus, the duration of the carrier bursts necessary to convey the control data are substantially reduced when modulation is effected with the TS3 pulses as compared to the time the carrier would be generated if modulation were controlled by the command signal pulses TS2 (hatched). This economy enables the amplitude of the carrier to be substantially increased so that desirable range may be obtained with a controller having a low-sensitivity, low-cost detector operated within average power limits set by the F.C.C.

Regarding receiver 14, FIG. 3 shows that at the receiver, the initially generated pulse-width modulated command signals are reconstituted so that the command information; e.g., receiver address and load control data, may be conveniently extracted. As seen in FIG. 3, the intervals of the receiver system clock, CLR, are substantially the same as those of the transmitter clock, CLT. Further, the signals presented to the demodulator include the modulated r.f. signals of the transmitter, RS1. Following demodulation; as for example by a superregenerative technique, detection signal pulses, RS2, are generated which correspond to the envelope of the carrier signals; i.e., the modulation signals TS3. As will be appreciated, the form of RS2 shown in FIG. 3 is a form that would result following filtering and shaping. As in the case of the modulation signals, the 1's and 0's of the command information is represented by the position in time of the pulses.

Finally, FIG. 4 shows that following conversion of the detection signals, serial, pulse width modulated signals RS3 are generated which correspond to the serial, pulse-width modulated signals of the transmitter, TS2.

Figure 5:
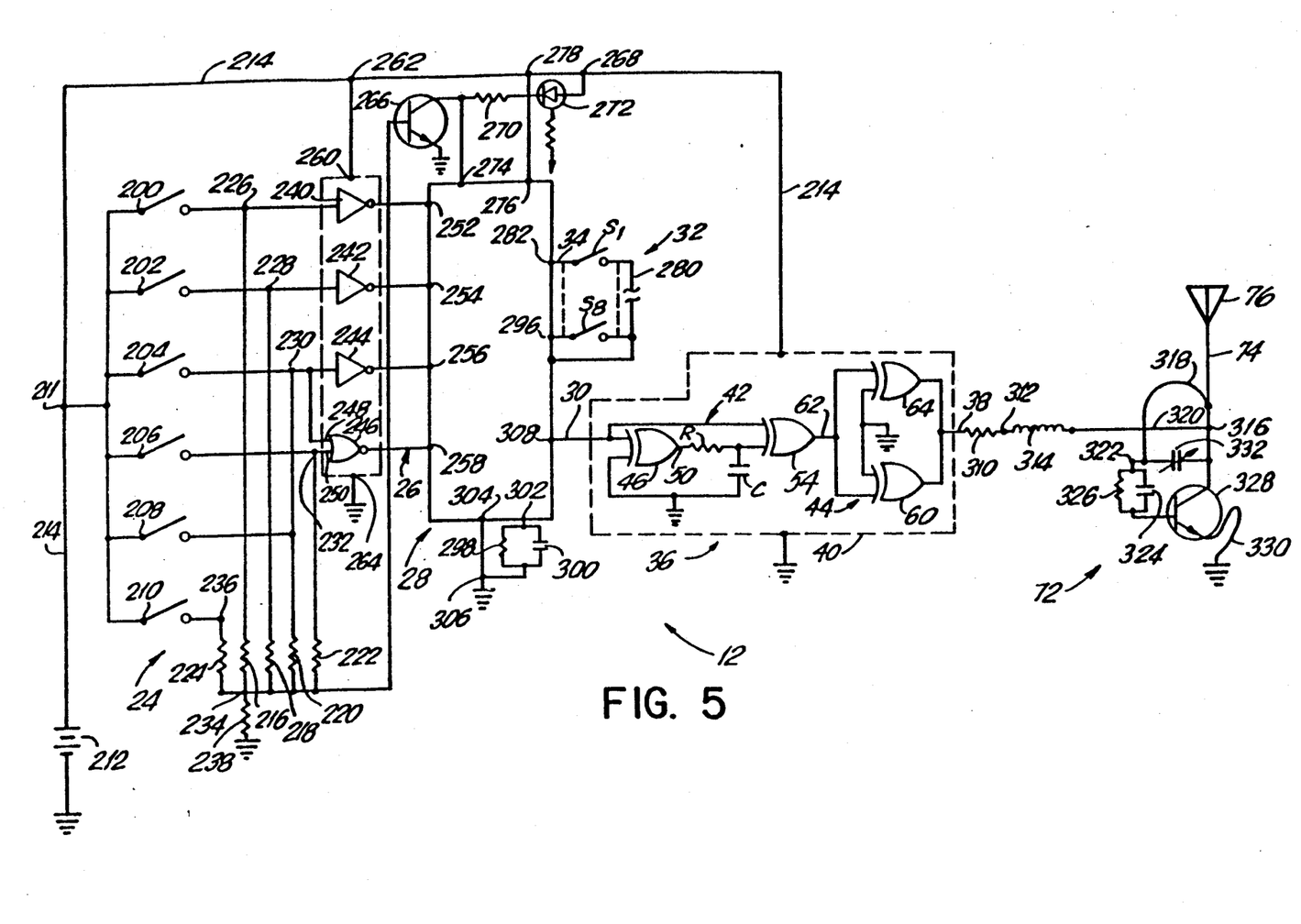
FIG. 5 is a schematic diagram of the electrical circuitry associated with the transmitter of the r.f. controller that may include the superregenerative detector in accordance with this invention.
Figure 6:
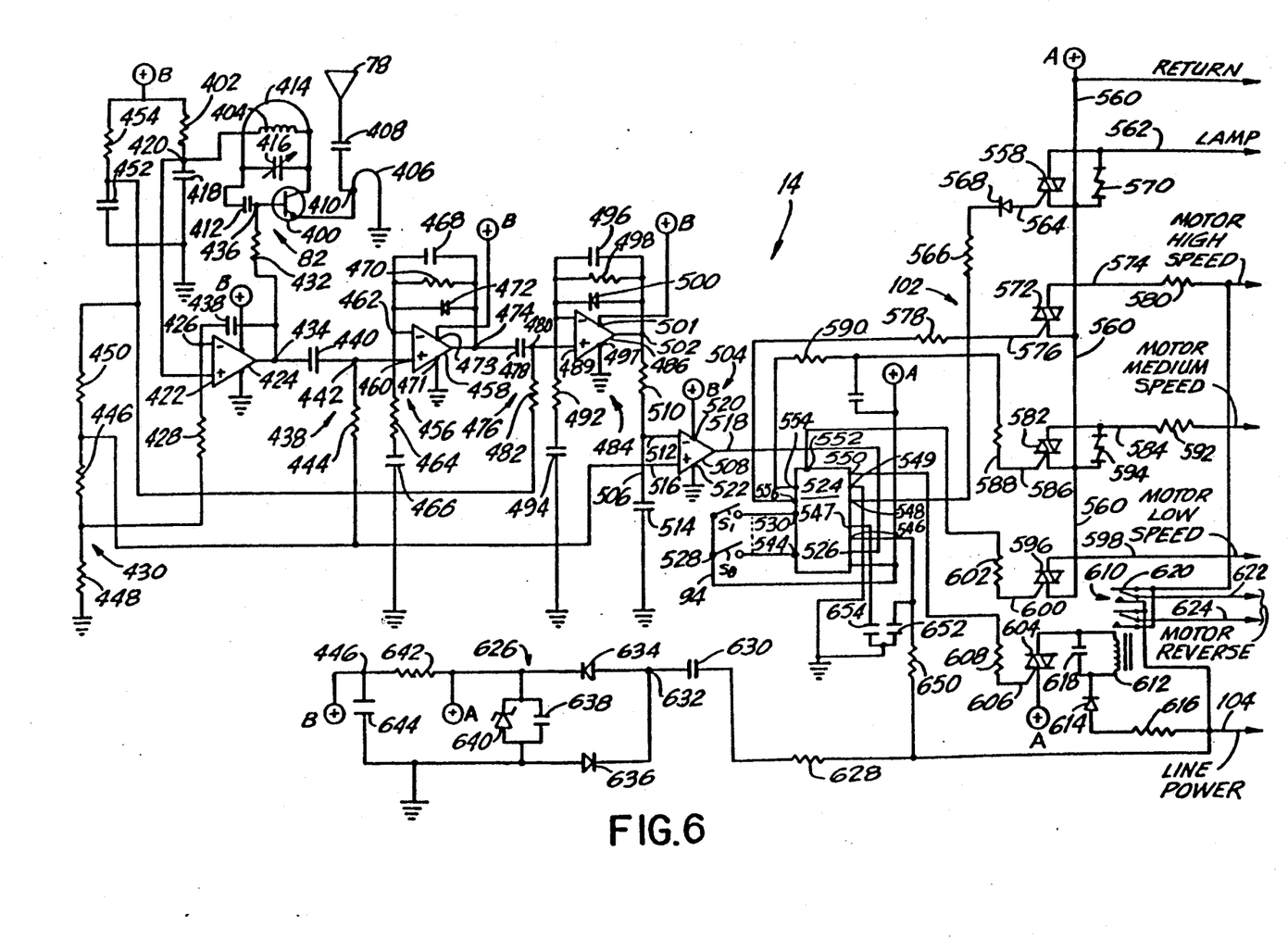
FIG. 6, is a schematic diagram of the electrical circuitry associated with the receiver of the r.f. controller that may include the superregenerative detector in accordance with this invention.

A more detailed understanding of controller 10 and the elements which make up the above described subsystems may be had with reference to FIGS. 5 and 6. Particularly, in FIG. 5, transmitter 12 is shown schematically.

As noted, to enable entry of load commands, transmitter 12 includes a key pad 24 having a plurality of command keys. As shown in FIG. 5, key pad 24 preferably includes 6 key switches, 200, 204, 206, 208, and 210, each of which is dedicated to a specific control command; particularly, lamp intensity stepping, fan forward direction, fan reverse direction, fan medium speed, low speed and high speed, respectively. To facilitate command signal identification and subsequent processing, switches 200 and 210 are connected in circuits configured to provide both a signal specific to activation of each of the keys, and a signal specific to activation of any key. On a first side, each of the switches is connected at node 21 to the positive side of battery 212; e.g., 9 volt. As shown, the negative side of battery 212 is connected to ground. The second sides of switches 200, 202, 204, and 210 are, respectively, connected to resistors 216, 218, 222, and 224 at nodes 226, 228, 232 and 236. In the case of switches 204 and 208, their second sides are connected together, and to resistor 220 at node 230. Further, resistors 216, 218, 220, 222 and 224 are connected to one side of resistor 238 at node 234, the other side of resistor 238 being connected to ground. Accordingly, when any of the key switches is closed, a signal is produced both at the node where the particular switch is connected to its companion resistor, and at node 234 proximate resistor 238. The signal at the companion resistor uniquely identifies the particular switch closed, while the signal at resistor 238 alerts other circuits of the receiver that a command has been entered, and to prepare for its receipt.

Continuing, to enable communication of the load commands to the UAT circuitry without loading the UAT data inputs, key pad 24, as shown in FIG. 5, includes a plurality of inverters 240, 242, 244, as well as NOR gate 246 connected between key pad switches 200 to 210 and UAT 28. As shown, key switch 200 is connected to the input of inverter 240 at node 226; switch 202 to the input of inverter 242 at node 228; and switches 204 and 208 to the input of inverter 244 at node 230. Further, switches 204 and 208 are connected to a first input 248 of gate 246 at node 230, and switch 206 connected to a second input 250 of gate 246 at node 232. The output of inverters, 240, 242, 248 and NOR gate 246 are connected to data inputs 252, 254, 256 and 258, respectively, of UAT 28.

As noted earlier, the 6 keys of pad 24 are arranged to provide a 4 bit, parallel, digital, data signal, TS1, at the 4 lines which constitutes output 26 of pad 24. With this arrangement, each of the 6 command signals that can be selected by manipulating the various key switches, may be uniquely encoded to 1 of 6 of the 16 possible states that can be represented on the 4 data lines 26; it will be recalled that N parallel, digital data lines are capable of defining $2^N$ unique binary state codes.

In controller 10, inverters 240, 242, 244 and NOR gate 246 can be implemented in single integrated circuit. Where a single integrated circuit is used, power may be provided at node 260 by connection to supply line 214 at node 262. Ground is provided at node 264.

Continuing with reference to FIG. 5, controller 10, to avoid unnecessary drain of battery 212, UAT 28 is not turned on until a control command is entered at pad 24. To facilitate this, a power management switch is provided in the form of transistor 266. As shown, transistor 266 is arranged with its collector tied to power line 214 and its emitter grounded. More particularly, the transistor collector is connected to power line 214 at node 268 through resistor 270 and light emitting diode 272. Additionally, the transistor collector is also seen to be strapped to UAT power control input 274. Further, the base of transistor 266 is connected to node 234 of key pad 24. Still further, UAT power input 276 is connected to battery supply line 214 at node 278.

In operation, when any one of the command keys is closed, in addition to generating the corresponding signal pattern at the respective switch nodes, a current is generated at node 234 which drives normally off transistor 266 into conduction. As transistor 266 is caused to conduct, LED 272 lights, thereby indicating power has been turned on. Additionally, a power initiate signal is given to UAT 28 at input 274. The power initiate signal, thereafter, causes UAT 28 to power up and read the command data code provided at inputs 252, 254, 256 and 258. As will be appreciated, in this arrangement, resistor 216 to 224 and 238, as combined with transistor 266, establish an inexpensive OR gate for enabling power up of UAT 28 when any of the command keys is closed.

Since most physical barriers are transparent to r.f. signals, to avoid unintended control of non-companion receivers within the range of transmitter 12, means are provided for adding a unique address to the command signal. As seen in FIG. 5, UAT 28 is provided with an 8-line, DIP switch 280 which constitutes address code storage means 32 in preferred form. Particularly, switch 280 includes switch elements S1 to S8 (two of which are shown) respectively connected to UAT address code inputs 282 to 296. With this arrangement, 1 of 256 address codes may be manually set by closing or leaving open the various switch elements as is known in the art.

Continuing with reference to FIG. 5, UAT 28 is also seen to have external means for controlling its clock frequency. Particularly, resistor 298 and capacitor 300 are connected in parallel between UAT timing input 302 and ground at node 306. As will be appreciated, by varying the valves of resistor 298 and/or capacitor 300, the clock of UAT 28 may be readily adjusted. As also shown in FIG. 5, UAT 28 is strapped to ground at input 304.

In controller 10, UAT 28 is a specially prepared integrated circuit which includes only the transmission circuitry typically found in a conventional universal asynchronous receiver transmitter integrated circuit (UART). As is known, standard integrated circuits are available which include both the transmission and reception circuitry required for asynchronous data communication. However, since by nature, the receiver of an r.f. control system is physically displaced from the transmitter, the receiver circuitry of a conventional UART would not be used in unit 28. Therefore, in the interest of economy, a custom integrated circuit chip having only the circuitry necessary for transmission is preferably used.

As noted, the purpose of UAT 28 is to convert the parallel, digital command word generated by key pad 24 to a form more suitable for transmission; i.e. serial, digital, data word, and to add the receiver address data. To this end, UAT 28 produces a pulse-width modulated data word containing command information and receiver address information at output 308.

As also noted, in order to reduce the contribution to transmission power that would result if the command signals were used to modulate the r.f. oscillator, in controller 10, special signals are generated to modulate the r.f. oscillator. While the special modulation signals include the command and address data needed to control the load, they have substantially reduced pulse widths as compared with the command signals, thereby, reducing the time the carrier is required to be transmitted; i.e., reducing average carrier power.

To facilitate this, modulator 36 which generates the special signals is connected to UAT 28 at output 308. In controller 10, modulator 36 is a compound exclusive OR gate 40 arranged to trigger on the leading and trailing edges of the pulse-width modulated command signals. As shown, exclusive OR gate 40 includes a gate section 42 and buffer section 44. Since gate 40 was explained at length above, its elements and operation need not be again described here. Suffice it to say that at output 38 of gate 40, pulses of width determined by gate capacitor C and resistor R are generated, positioned in time at approximately the leading and trailing edges of the pulse-width modulated command signals.

Once the modulation signals are generated, they are used to modulate the amplitude of transmitter r.f. oscillator 72. As seen in FIG. 5, oscillator 72 includes a transistor 328 having a tuned circuit formed by a variable capacitor 332 and an inductor 318, inductor 318, preferably, being of the hairpin type. In this arrangement, capacitor 332 and inductor 318 are connected in parallel with each other and to the transistor collector at node 316. Additionally, oscillator 72 is seen to include a feedback network formed by the parallel combination of resistor 326 and capacitor 324 connected between the tuned circuit at node 322 and the transistor base. Oscillator 72 also includes a phase-shifting coil 330 connected between the transistor emitter and ground. Still further, oscillator 72 is provided with a drive network which includes series connected current limiting resistor 310 and isolation inductor 314 which, together, couple transistor 328 at collector node 316 to output 38 of modulator 36. Finally, antenna 76 is seen to be connected to inductor 318 of the oscillator tuned circuit, and is, preferably, of the bi-phase type commonly used in applications of the kind described here.

In operation, when a pulse is generated at output 38 of modulator 36, the drive network of oscillator 72 couples the pulse to the tuned circuit formed by capacitor 332 and inductor 318, exciting the circuit and causing it to resonate. The energy from the resonant circuit is, thereafter, fed through capacitor 324 to the base of transistor 328 where it is amplified and supplied to the transistor collector circuit to reinforce the resonance and sustain oscillation. Continued feedback to maintain the oscillation is, again, provided through capacitor 324. Coil 330 located in the transistor emitter circuit provides the required phase shift to assure the amplified feedback signal is in phase with and reinforces the oscillations in the tuned circuit.

As will be appreciated, the average value of the modulation pulse supplied by feedback resistor 326 provides the d.c. bias to maintain transistor 328 on. Accordingly, when the modulation pulse terminates, bias for the transistor is removed, and the transistor action necessary to sustain oscillation is interrupted. Thus, the oscillator signal is generated during the modulation pulses, but not between modulation pulses.

In accordance with conventional design techniques, capacitor 332 of the oscillator tuned circuit is made variable so that the frequency of oscillator 72, which is preferably selected to be approximately 300 megahertz, may be adjusted.

Continuing, inductor 314 of the oscillator drive network is selected to act as a high frequency stop to the oscillator signal in order to insure oscillator signal is not fed into modulator 36. Antenna 76, on the other hand, is connected to inductor 318 of the oscillator tuned circuit so as to couple the r.f. oscillations for radiation to the receiver.

Turning next to the system receiver, a more detailed understanding of it may be had with reference to FIG. 6, where it is shown schematically. As seen in FIG. 6, receiver 12 includes antenna 78 connected to detector 82 for respectively receiving the modulated carrier signal of transmitter 12 and recovering the load control information. As noted, detector 82 is preferably of the superregenerative type. Accordingly, it includes a first oscillator tuned to the carrier frequency; e.g., 300 megahertz, and a second oscillator arranged to oscillate at frequency which, while substantially lower than the high frequency, is, none the less, higher than the modulation signal frequency; e.g., approximately 400 kilohertz. Further, the high-frequency oscillator is arranged to turn on and off in response to the low-frequency oscillation and at a point in time dependent on the amplitude of the received carrier signal. In this way, the received carrier is able to produce a signal of predetermined strength having a duration and associated d.c. value that depends upon the change in amplitude of the received carrier; i.e., the carrier modulation envelope.

As seen in FIG. 6, detector 82 includes a transistor 400 having its collector connected to a source of power through current limiting resistor 402 and r.f. inductor 404. The emitter of transistor 400 is connected to ground through an inductor 406, preferably of the hairpin type, and, additionally, to antenna 78 through a high-frequency pass capacitor 408 at node 410. Continuing, the base of detector transistor 400 is connected to the transistor collector through a feedback capacitor 412 and a resonant circuit formed by the parallel combination of inductor 414, also preferably of the hairpin type, and a variable capacitor 416.

Still further a smoothing capacitor 418 is connected across transistor 400 between node 420 and ground. Additionally, node 420 is also seen to be connected to a first input 422 of operational amplifier (op amp) 424. The second input 426 of op amp 424 is connected through current limiting resistor 428 to a constant reference voltage provided from one tap of voltage divider 430.

As shown in FIG. 6, voltage divider 430 is of a conventional type having a plurality of resistors; i.e., 454, 450, 446, and 448 connected in series between power supply tap "B" and ground. As known in the art, a reference voltage of predetermined value may be established at each of the resistors by appropriate selection of component values.

Finally, the output of op amp 424 is seen to be connected to the base of transistor 400 through a feedback resistor 432 connected between the output node 434 of op amp 434 and transistor base input node 436. A feedback capacitor 438 is connected between op amp output 434 and reference signal input 426.

In this arrangement, the high-frequency oscillator of the superregenerative detector is generated by the tank circuit of inductor 414 and capacitor 416 connected through capacitor 412 in feedback relation with transistor 400. The low-frequency oscillator of the detector, on the other hand, is generated by inductor 404 and capacitor 418 as connected to transistor 400. Further, capacitor 408 and inductor 406 connected at the transistor emitter constitute an input circuit for carrier signal received at antenna 78.

In operation, when power is applied to transistor 400, the low-frequency oscillation provided by inductor 404 and capacitor 418 enables the high-frequency oscillation resulting from feedback of tank circuit, to be turned on and off at a rate corresponding to the low frequency signal.

In the absence of received signal at emitter inductor 406, the high-frequency oscillation at the tank circuit arises randomly in response to circuit noise when the low-frequency oscillation of inductor 404 and capacitor 418 provide adequate collector signal for transistor action. The high-frequency oscillation burst so initiated continues until the low-frequency oscillation diminishes the collector signal so as to interrupt transistor action.

However, when carrier signal is received at emitter inductor 406 from antenna 78, it combines with the low-frequency oscillation to cause transistor action and tank circuit oscillation to arise earlier in time than when no carrier was present; i.e., at the occurrence of r.f. signal at emitter inductor 406, and, to, thereafter, continue longer. Thus, the duration of the high-frequency burst is made dependent on the amplitude of the received carrier, while the amplitude of the high-frequency burst is made dependent on predetermined circuit parameter and substantially independent of carrier amplitude.

Since the duration of the high-frequency burst increases with the amplitude of carrier received at emitter inductor 406, the presence or absence of carrier signal at antenna 78 may be indicated by the average value of the transistor output, following smoothing. In this regard, it will be appreciated that inductor 404 and capacitor 418 also function as a low-pass filler to smooth the transistor output. Accordingly, the output of transistor 400 corresponds to the envelope of the modulated carrier received at antenna 78, i.e. the modulation pulses of transmitter 12.

In accordance with the invention following smoothing at inductor 404 and capacitor 418, the output of transistor 400 is supplied to op amp 424 at signal input 422. When the smoothed transistor output, i.e., carrier envelope, exceeds a predetermined value established at op amp difference input 426 by the reference voltage supplied at network 430, a signal is generated at op amp output 434. Further, the signal at output 434 continues until the smooth transistor output presented to op amp input 422 falls below the reference value at input 426; i.e., when the carrier signal at inductor 406 terminates. As will be appreciated, the presence of feedback capacitor 438 between op amp output 434 and reference input 426 permits the high-frequency components of the transistor output to be further reduced.

As will also be appreciated, to maintain proper operation of detector 82, transistor 400 must sustain superregenerative operation; i.e., high frequency oscillation bursts in response to the low-frequency oscillation and received carrier signal. To insure that superregenerative operation is not distorted by transistor operating characteristics, detector 82 in accordance with the invention features means for controlling the operating point, i.e. bias, of transistor 400. Particularly, feedback of the detector output is used to insure transistor bias is maintained at the linear portion of the transistor operating characteristic. In this way, not only is distortion due to bias shift avoided, but also use of inexpensive transistors having limited or variant linear regions is possible, the feedback enabling dynamic control of the bias point at the linear portion of the transistor characteristic.

To facilitate the feedback control of transistor bias, the output 434 of op amp 424 is connected to the base of transistor 400 at node 436, through feedback resistor 432.

Following generation of the detector signals, the receiver has available to it the load control information originally encoded at transmitter 12. Therefore, and as previously noted, the detector output can be immediately decoded to produce the load drive signals. However, in accordance with the invention, to reduce the likelihood that spurious signals arising from radiated noise; e.g., appliance motors, auto ignition, etc., will cause false load control, the detector output is first filtered to verify authenticity of the control information.

To provide signal verification, the detector output is passed through multiple stages of cascaded high-pass and low-pass filtering. As noted in connection with the description of converter 86, the high-pass filtering is configured to pass detector output pulses having widthes approximating the width of the transmitter modulation pulses, while the low-pass filtering is configured to pass sequential detector pulses spaced in time within a range anticipated for the transmitter modulation pulses, i.e., the range of widths for the transmitter pulse-width modulated control signals. As will be appreciated detector pulses outside the pass bands of the filtering are rejected, thereby reducing the likelihood of spurious control signals.

As seen in FIG. 6, a first, high-pass filter stage 438 is connected to the output of detector 82. First stage 438 includes a capacitor 440 connected in series with the output of op amp 424 at node 434, and a shunt resistor network including the series combination of resistor 444, 446 and 448 connected between capacitor node 442 and ground. As will be appreciated, capacitor 440 and resistors 444, 446 and 448 are selected to pass the high-frequency anticipated for pulses having a width corresponding approximately to the transmitter modulation pulses above described; i.e. the output of transmitter exclusive OR gate 40.

Continuing, a first low-pass filter stage 456 is provided connected to high-pass filter stage 438. As shown, low-pass filter 456 is preferably of the operational-amplifier type to facilitate integrated circuit implementation. It includes op amp 458 having a signal input 460 connected in series with capacitor 440 of high-pass filter 438. Further, the reference input 462 of op amp 458 is connected to ground through resistor 464 and capacitor 466, while the parallel combination of feedback capacitor 468 and resistor 470 is connected between op amp reference input 462 and output node 474. As shown, op amp 458 is connected to power at node 473 and to ground at node 471. As will be appreciated, this combination of elements limits the high-frequency components of the filter signal output.

As shown, a feedback diode 472 is also provided between the output and reference input of op amp 458, poled with its anode connected to output node 470. As connected, diode 472 clips, and, thereby, eliminates any positive-going signal portion; e.g., ringing, and allows only the negative portion of the pulse signal to pass.

The elements of low-pass filter stage 458 are selected in a conventional fashion so as to pass the low-frequency anticipated for a waveform comprising sequential, narrow pulses spaced in time within a range corresponding approximately to the range for the transmitter modulation pulses described previously. As will be recalled, the spacing of the modulation pulse corresponds to the leading and trailing edges of the pulse-width modulated load control signals produced at the output of UAT 28.

As seen in FIG. 6, a second, high-pass filter stage 476 is connected to the output of first, low-pass filter stage 458. As shown, like first stage 438, the second, high-pass filter stage 476 includes a capacitor and resistor network. Particularly, second, high-pass stage 476 includes capacitor 478 connected in series with the output node 474 of preceding low-pass stage 456. Additionally, a shunt resistor network is provided including the series combination of resistors 482, 450, 446 and 448 connected between capacitor node 480 and ground. Like first, high-pass stage 438, the elements of second, high-pass stage 476 are selected to pass the high frequencies anticipated for pulses having a width corresponding approximately to the transmitter modulation pulses.

Receiver 14 also includes a second, low-pass filter stage 484. As shown, filter stage 484 is connected to the output of the preceding high-pass filter 476. Like first low-pass stage 458, stage 484 is of the op-amp type, and includes op amp 486 having a signal input 488 connected in series with capacitor 478 of preceding high-pass stage 476. The reference input 490 of op amp 486 is connected to ground through resistor 492 and capacitor 494. Further, the parallel combination of feedback capacitor 496 and resistor 498 are connected between op amp reference input 490 and output node 502. As in the case of the first low-pass stage, feedback diode 500 is poled with its anode connected to the op amp output in order to eliminate any positive-going portion of the output signal. As shown, power is supplied to op amp 486 at node 501, and ground at node 497.

Like first stage 456, the elements of second low-pass filter 484 are selected to limit the high-frequency components of the filtered output signal. More particularly, filter stage 484 is intended to pass a waveform corresponding to the sequence of pulses spaced in time within a range corresponding approximately to the transmitter modulation pulses.

Following filtering, the receiver signals are preferably shaped to provide a waveform more closely approximating that of the transmitter modulation pulses; i.e., short duration rectangular pulses. For this purpose, receiver 12 includes wave shapes 504 connected to the output of second low-pass filter stage 484. As seen in FIG. 6, wave shapes 504 includes a further stage of low-pass filtering 506 and an op amp 508 configured as a threshold detector. More particularly, low-pass filter 506 includes a series resistor 510 connected between output node 502 of second low-pass filter stage 497 and the negative input 512 of op amp 508. Additionally, low-pass filter 500 includes a shunt capacitor 514 connected between op amp input 512 and ground. Still further, the positive input 516 of op amp 508 is connected to voltage divider network 430 at resistor 446. The output of op amp 508 is provided at line 518. Op amp 508 is also seen to be connected to power at node 520 and to ground at node 522.

As noted, op amp 508 is configured as a threshold detector. Accordingly, when the output of filter stage 487; i.e., the detector signals, exceeds (absolute value) the reference signal at op amp input 516, the output of op amp 508 at line 518 rises to a predetermined amplitude at a predetermined rate, the amplitude and rate being established in a conventional manner by selection of circuit parameters. Further, the output of op amp 508 remains at the predetermined amplitude until the signal from filter stage 497 falls below (absolute value) the reference signal established by voltage divider 430, whereupon, the op amp output falls to zero, again at a circuit determined rate. In this way, a well defined rectangular pulse having a predetermined amplitude rise time and fall time may be generated in response to the filtered detector signal.

As noted earlier, since the filtered and shaped detector pulses include the load control and load address information encoded in the pulse positions, they could be used to generate the load control signals without further manipulation. However, in the interests of low-cost and simple decoding, the filtered and shaped detector signals are preferably first converted to pulse-width modulated signals corresponding to the pulse-width modulated command signals generated at transmitter 12. In this way, inexpensive universal asynchronous receiver circuitry can be used to recover the load control information.

To effect signal conversion and decoding, the output of wave shaper 504 at line 518 is connected to a custom integrated circuit chip 524 at input 526. While not shown for simplicity of the drawing, circuit chip 524 includes elements of previously described signal converter 86 and elements of decoder 90; particularly, UAR 92 and recognition logic 96.

In preferred form, the signal transformer of converter 86 is implemented in the circuits of chip 524 as a flip-flop configured to generate pulse-width modulated signals corresponding to the command signals generated at transmitter 12 in response to the filtered and shaped detector signals.

In operation, successive detector pulses presented at chip input 524 cause the converter flip-flop to turn on and off such that the load control and address information encoded in the positions of the pulses; i.e., the time between successive pulses, is converted to the width of the flip-flop output pulses. Thereafter, the resulting pulse-width modulated signals of the converter can be presented to the decoder UAR also implemented in the circuitry of chip 524.

As noted previously, to assure the UAR decodes only signals intended for loads associated with receiver 14, the decoder includes address recognition elements to enable identification of control signals intended for receiver 14. To facilitate signal recognition, the decoder includes address storage means 94 which is provided with data that uniquely identifies the receiver, the data being selected to correspond to the identification data stored at the transmitter and encoded into the command signal. As seen in FIG. 6, address storage means 94, like that of the transmitter, includes an 8-line, DIP switch 528 having switch elements S1 to S8 (two of which are shown) respectively connected to address code inputs 530 to 544 of chip 524 and receiver power. With this arrangement, 1 of 256 address codes may be manually set by closing or leaving open various switch elements, the pattern being selected to be identical to that of transmitter address code switch 280.

The address code data provided by powered switches S1 to S8 is supplied internally of chip 524 to a comparator of the decoder UAR. At the comparator, the address data of the converter command signal is checked to determine if the control information is intended for the receiver loads. If it is, the command signal is read into the UAR for decoding. As noted, the comparison may be repeated several times; i.e., clock cycles, to assure correspondence.

Once a command signal is recognized as intended for receiver 14, the UAR circuitry of chip 524 transforms the serial, pulse-width modulated converter signal and the load control information it contains into a parallel, digital, data word. Thereafter, and as described above, the parallel, digital, data words may be supplied to recognition logic, also implemented in chip 524, to convert the control information to load control signals. More particularly, the recognition logic, preferably a demultiplexer, interprets the control data content of the command words in a conventional fashion and generates signals at the respective chip outputs dedicated to the load command corresponding to the data. Specifically, and as shown in FIG. 6, control signals for lamp intensity stepping are provided at chip output 548; for fan forward and reverse directions at output 550; for fan low speed at output 552; for fan medium speed at output 554; and for fan high speed at output 556.

As also seen in FIG. 6, line synchronization for chip 524 is provided at chip input 546, input 546 being connected to line power at source 104 through current limiting resistor 650. Capacitor 652 shown connected between input 546 and ground provides high-frequency, bypass filtering. Further, timing stabilization for chip 524 is provided at input 547, input 547 being connected to ground through capacitor 654. Finally, ground for chip 524 is provided at chip input 549.

Continuing with reference to FIG. 6, receiver 14 is seen to further include driver 102 for implementing the control signals of chip 524 at the loads; e.g., the ceiling fan and companion light. Load driver 102 includes a plurality of gated switching elements, specifically, triacs, each of which is connected to a load associated with the fan; e.g., the motor main winding, various speed windings, the lamp and power. In this arrangement, the control signals generated by the decoder of chip 524 control the conduction angles of the triacs, which in turn control the supply of power to the receiver loads.

As seen in FIG. 6, driver 102 includes a triac 558 connected between power distribution line 560 and lamp feed line 562. As shown, triac gate input 564 is connected to the lamp control output 548 of chip 524 through current limiting resistor 566 and a blocking diode 568. Additionally, a varristor 570 is connected across triac 558 between power distribution line 560 and lamp feed line 562.

In operation, when a lamp control signal is generated at chip 524 in response to a command entered at transmitter 12, triac 578 is gated on and power supplied to the fan lamp. In accordance with the invention, chip 524 is arranged to increase the conduction angle of triac 558, so as to power the lamp for longer time intervals, thereby increasing the light intensity of the lamp in response to successive light stepping commands entered at the transmitter. As will be appreciated, resistor 566, diode 568 and varristor 570 are provided for protective purposes. Resistor 566 limits the gate signal level to triac 558, diode 568 protects chip 524 from signals that might be feed back from triac 558, and varristor 570 protects triac 558 from surges arising during switching.

Continuing, load driver 102 also includes a triac 572 connected between power distribution line 560 and feed line 574 for the fan motor high-speed winding. Like triac 558, triac 572 is connected to one of the control outputs of chip 524. Particularly, gate input 576 of triac 572 is connected to output 556 of chip 524 through current limiting resistor 578. Accordingly, when a control for motor high speed is generated at chip 524 responsive to a command entered at transmitter 12, triac 572 is gated on, activating the high-speed winding. As shown, resistor 580 is provided in feed line 574 to limit the drive supplied.

In a like fashion, triac 582 is connected between power distribution line 560 and feed line 584 for the fan motor medium-speed winding. Again, the triac is connected to chip 524 for control. Particularly, gate input 586 is connected to chip control output 554 through current limiting resistors 588 and 590. A current limiting resistor 592 in feed line 584, and a varristor 594 across triac 582 are provided for circuit protection. When a control signal for fan medium speed is generated at chip 523, power is supplied over line 584 to the motor medium-speed winding.

And, again, in like fashion, triac 596 is connected between power distribution line 560 and feed line 598 for the motor low-speed winding. As in the case of the high and medium speed triacs, triac 596 is connected to chip 524 for control. As shown, triac gate input 600 is connected to chip control output 552 through current limiting resistor 602. When a control signal for fan low speed is generated at chip 524, power is fed over line 598 to the motor low-speed winding.

As will be appreciated, chip 524 is arranged such that the speed control signals are exclusive in time; i.e., chip 524 will generate a control signal for only one fan speed at a time. Further, once a speed is selected, chip 524 manages the conduction angle of the respective triac to supply required power to the appropriate winding until another speed is selected. As will also be appreciated, power for fan action is provided when any of the fan speeds has been selected.

Load driver 102 also includes a triac connected between line power 104 and the receiver internal power supply 626 for effecting fan reversal. Like the other triacs, triac 604 is connected to a control signal output of chip 524. Particularly, triac gate input 606 is connected to output 550 of chip 524 through current limiting resistor 608. To facilitate fan direction reversal, triac 604 is also connected to a fan motor polarity reversing relay 610. As shown, triac 604 is connected to one side of activation winding 612 of relay 610, winding 612 being connected on its other side to line power through diode 614 and current limiting resistor 616. A capacitor 618 is connected across relay winding 612. As also seen, relay 610 is provided with a set of double-pull-double-throw relay contacts 620 connected between line power 104 and fan motor forward feed line 622, reverse feed line 624 and high-speed winding fee line 574.

Accordingly, when a control signal is generated at chip 524 responsive to a command entered at transmitter 12 for forward or reverse fan direction, triac 604 is gated to establish a reversal of current flow in relay winding 612. When the direction of current flow in winding 612 reverses, contacts 620 are reset to reverse the polarity of the fan motor and, thereby, reverse fan direction.

Finally, receiver 14 also includes an internal power supply to provide power both to the receiver loads and the receiver circuitry. As seen in FIG. 6, power supply 626 is a substantially conventional, half-wave, multiplication rectifier including elements for output regulation. Particularly, supply 626 includes a current limiting resistor 628 connected between line power 104 and one side of an input capacitor 630. The other side of capacitor 630 is connected at node 632 to the junction of two oppositely poled rectifier diodes 634, 636. As shown, the unjoined poles of diodes 634, 636, are connected across the parallel combination of output filter capacitor 638 and a zener, regulation diode 640 to form tap "A" of supply 626, at which regulated and filtered half-wave power is provided.

As seen in FIG. 6, supply 626 also includes a second tap "B." As shown, tap "B" is formed by an combination of limiting resistor 642 and filter capacitor 644 connected across supply tap "A", tap "B" being set at node 646 between resistor 642 and capacitor 544. Like tap "A", tap "B" provides regulated and filtered half-wave power. However, the level of power at tap "B" is reduced as compared with that at tap "A" base on the selected values for resistor 642 and capacitor 644, as is known in the art, tap "B" being intended to supply particular components of the receiver as shown.

As noted, controller 10 also contemplates a method for remotely controlling electrical loads having resistive or complex impedances. In controller 10, a preferred form of the method includes generating coded command signals in the form of pulse-width modulated pulses, wherein the width of the pulses conveys the load control data. The command signals may be generated by first generating a command selection signal; e.g., where a user manually enters a command request at a key pad. As will be appreciated, other steps could be used for generating the command selection requests, particularly, an automated response to a transducer sensitive to a condition intended to control one or more of the loads. An illustration would be control of a room fan in response to room temperature, or control of lamps in response to the level of room lighting.

In preferred form, the command selection signals comprise multibit, parallel, digital, data words containing the information necessary to uniquely identify the command and effect control of the loads. Following generation of the command selection signals, the signals are prepared for subsequent transmission by first converting them to multibit, serial, pulse-width modulated signals including, in preferred form, address data sufficient to uniquely identify the receiver associated with the loads to be controlled. Additionally, signal synchronization and start recognition data may also be included to aid signal processing.

In controller 10, following generation of the command signals, a modulation signal is generated having pulses whose positions in time correspond to the leading and trailing edges of the pulse-width modulated, command signals. The modulation signals may be generated by differentiating the command signals.

The method, thereafter, calls for the generation of r.f. signals whose amplitude is modulated at points in time corresponding to the pulses of the modulation signals. In controller 10, the modulation signals adjust the amplitude of the r.f. signals by controlling an oscillator which generates the r.f. signals; e.g., by turning the oscillator on and off in response to the modulation signals. Next, the modulated r.f. signals may be radiated in a manner well known in the art.

In this way, the average power of the modulated r.f. signal may be reduced as compared with the r.f. signals that would result if modulation were effected with pulse-width modulated command signals.

Following radiation, the r.f. signals containing the address, load control, and other data are received proximate the loads to be controlled. Thereafter, the r.f. signals are demodulated to generate detection signals having pulses whose position in time correspond to the pulses of the modulation signals. In controller 10, a superregenerative detection method is used to generate the detection signals from the received modulated r.f. signals.

In accordance with the broad aspect of the method, following generation of the detection signals, the detection signals are decoded to generate load control signals. This may be done with pulse-position decoding techniques known to those skilled in the art.

Finally, following generation of the load control signals, the loads are electrically driven in a known manner; e.g., with-triggered electrical switches, in accordance with the data contained in the load control signals.

In controller 10, in order to simplify decoding, the detection signals are first converted to multibit, serial, pulse-width modulated, digital, data word signals containing the load control information which corresponds to the command signals first generated. This may be readily accomplished by driving a flip-flop with the detection signals in a fashion known in the art.

Following generation of the detection signals and prior to the conversion of the detection signals to the pulse-width modulated signals described above, the detection signals are filtered to exclude detection signal pulses not corresponding in width or position in time to the pulses of the modulation signals. As will be appreciated, this filtration has the effect of limiting the presence of spurious control signals.

After filtration, the detection signals may be shaped to give them a substantially rectangular form. This may be done in any convenient manner; e.g., by driving an operational amplifier at one input with a constant value reference signal and the other input with the filtered detection signals.

In controller 10, following conversion, the detection signals are decoded to generate load control signals. More particularly, the pulse-width modulated signals may be examined to determine if the address data contained corresponds to address data made available during decoding; e.g., by comparing the converted signal data with stored address data. Preferably, the comparison may be made multiple times; e.g., twice, to assure correspondence.

Once the converted detection signals have been confirmed as valid, the load control data contained therein can be converted to multibit, parallel, digital, data words and, thereafter, demultiplexed, in a manner well known in the art; e.g., with the use of data recognition logic, to generate load control signals.

Finally, following generation of the load control signals, the loads may be driven in accordance with the control data to effect the commands initially selected. In controller 10, the load control signals may be used to trigger gated switches connected to the loads to effect the desired control.

While the apparatus and method aspects of this invention has been described in their preferred forms, it will be appreciated that changes may be made in nature, construction, and arrangement of the elements and steps without departing from the true spirit and scope of the invention.

What I claim is:

1. In a superregenerative detector including means for receiving a high frequency carrier having an amplitude envelope upon which an information signal is impressed; a first oscillator for generating a signal having a frequency corresponding to the frequency of the carrier; and a second oscillator for generating a signal having a frequency lower than that of the first oscillator, but higher that the information signal, wherein the duration of the first oscillator signal is responsive to the amplitude of the second oscillator signal and the amplitude of the received carrier, and output means for providing a detector signal corresponding to the information signal, the improvement comprising: detector output means including feedback means connected to the first and second oscillators for stabilizing the detector output signal during operation.

2. The detector of claim 1 wherein the feedback means includes an operational amplifier.

3. The detector of claim 2 wherein the feedback means operational amplifier includes a first input connected to the second oscillator and a second input connected to a predetermined reference signal, and an output connected to the first oscillator.

4. The detector of claim 3 wherein the first oscillator includes a transistor having a tank circuit coupled between the transistor collector and base, and the second oscillator includes an LC network coupled to the transistor collector and the first input of the operational amplifier, and wherein the output of the operational amplifier is connected to the transistor base.

* * * * *